Figure 2:
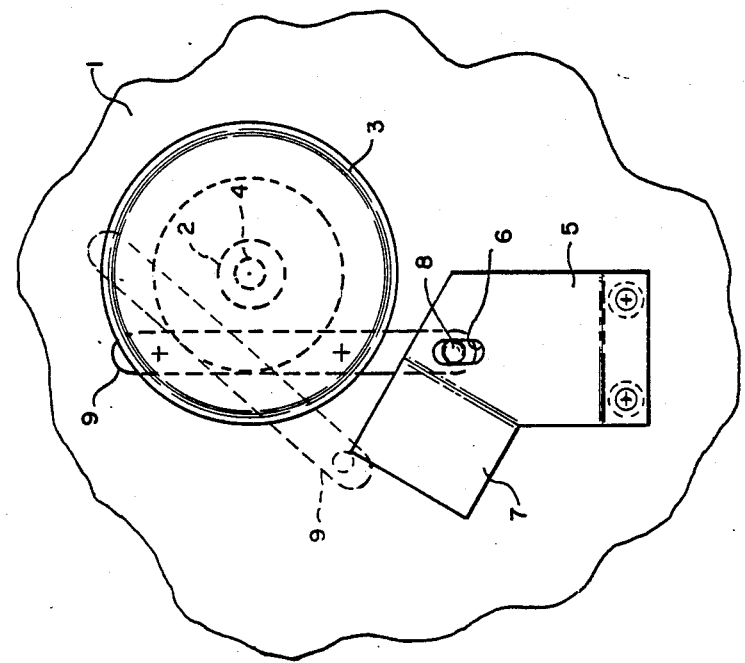

United States Patent [19]

Koek

[11] Patent Number: 4,922,247

[45] Date of Patent: May 1, 1990

[54] ENCODER MOUNT

[75] Inventor: Kevin C. Koek, Rochester, N.Y.

[73] Assignee: Eastman Kodak Company, Rochester, N.Y.

[21] Appl. No.: 892,561

[22] Filed: Aug. 4, 1986

[51] Int. Cl.⁵ .............................................. F16C 1/26
[52] U.S. Cl. ...................................... 341/2; 464/170; 464/172
[58] Field of Search .............. 340/347 P; 250/231 SE; 464/170, 172

[56] References Cited

U.S. PATENT DOCUMENTS 4,363,026 12/1982 Salmon ............................ 340/347 P Primary Examiner—William M. Shoop, Jr.
Assistant Examiner—Gary J. Romano
Attorney, Agent, or Firm—Leonard W. Treash

[57] ABSTRACT

An encoder is rigidly mounted to a component shaft and allowed to float with it, saving the expense of a flexible coupling and improving accuracy. An easily assembled detent prevents rotation of the encoder housing with the shaft.

2 Claims, 1 Drawing Sheet

U.S. Patent May 1, 1990 4,922,247

4,922,247

ENCODER MOUNT

This invention relates to a mount for a shaft angle encoder. More particularly, it relates to a mount for an encoder used in an application requiring precision, for example, as required in controlling a non impact printer.

A shaft angle encoder is a device which converts angular displacement of a rotatable member, for example, a component shaft, into an electrical signal. This signal can be used to monitor a component that moves with the shaft, for example, a drum, roller or web. In a non impact printer the signal can be used to synchronize other devices, for example, exposure of a photosensitive drum or web moving with the shaft, despite variations in the movement of the drum or web.

Conventionally, the component shaft and the encoder are independently attached to the frame of the structure. A rotatable member in the encoder and the component shaft are connected by a coupling which is flexible to allow for angular and axial misalignment inherent in manufacture and assembly. This flexible coupling naturally causes a small amount of inaccuracy in the encoder as it follows the angular displacement of the shaft.

It is an object of this invention to provide a mount for an encoder which permits the encoder assembly to convert angular displacement of a shaft into an electronic signal with greater accuracy than the prior art.

This object is accomplished by rigidly fixing the rotatable member in the encoder to the shaft and restricting movement of the encoder housing with respect to the frame only as to rotational movement about the axis of the shaft. Thus, the encoder housing "floats" with the shaft as the shaft moves transverse to its axis.

Because the rotatable member of the encoder is rigidly fixed to the component shaft, the encoder input matches the output from the shaft more accurately than when the flexible coupling is used. In electronic printing applications, where the encoder output controls the timing of an exposure device, this greatly reduces repetitive visible artifacts in printer output.

In addition to increasing accuracy of the device, elimination of the flexible coupling eliminates an element that is a significant portion of the cost of the encoding system.

According to a preferred embodiment of the invention, angular or rotational movement of the encoder housing is prevented by a detent formed by a first member fixed to the frame and a second member fixed to the encoder housing. The second member has a protrusion (for example, a spherical rivet) which fits in a slot or similar coupling discontinuity in the flexible member. Movement transverse to the axis is permitted by sliding movement of the protrusion in the slot and by slight rotation of the housing about the protrusion.

According to a further preferred embodiment, the first member is flexible and has a ramp facilitating easy coupling of the slot and protrusion.

Figure 1:
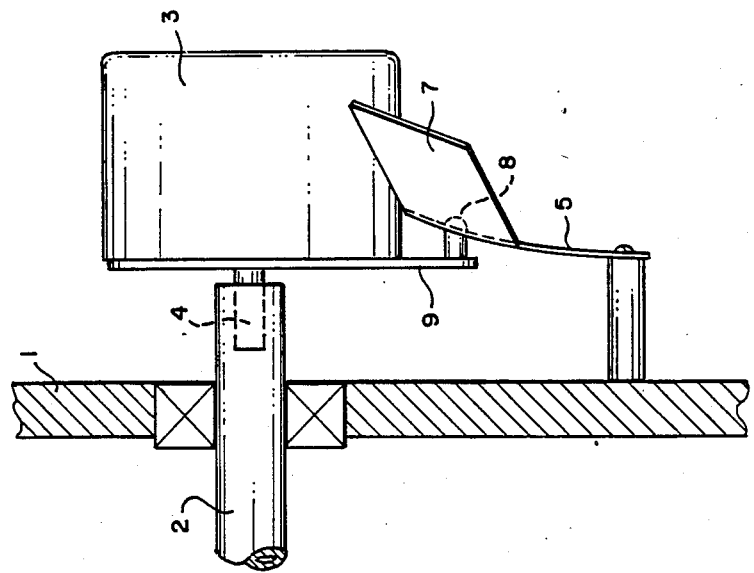

In the drawings:

FIGS. 1 and 2 are side and front views respectively of an encoder, a component shaft and a portion of an apparatus frame manufactured and assembled according to the invention.

Referring to FIGS. 1 and 2, a frame 1 of an apparatus using an encoder, for example a non-impact printer, supports for rotation a component shaft 2 whose angular displacement is to be monitored. The shaft can be rigidly connected to a component, for example, an electrophotographic drum, or a roller supporting an electrophotographic belt.

For various manufacturing and operational reasons the movement of such drums and belts varies slightly with time. If the exposure of such devices with, for example, a laser or an array of light-emitting diodes is done strictly according to time, visible artifacts, for example banding, will occur in the printed output.

It is well known to monitor the angular displacement of a shaft associated with such devices using an encoder and use the electrical signal from the encoder to control the printing operation according to the instantaneous position of the drum or belt to be printed upon.

An encoder housing 3 contains an encoder the details of which are not shown but which includes a rotatable member, for example, an encoder shaft 4. The encoder shaft 4 is mounted rigidly to the component shaft 2, for example, by a counter bored hole in the end of the component shaft which receives the encoder shaft with the two shafts being rigidly locked together with a set screw, or the like. No further support of the encoder is provided. It is allowed to float with traverse movement of the component shaft 2. Rotation of the encoder housing 3 about the axis of shaft 2 is prevented by a detent formed of a first, flexible member 5 and a second, elongated member 9. The first member 5 has a slot 6 and a ramp 7 and is rigidly secured at one end to the frame 1. The second, elongated member 9, is rigidly fixed to the encoder housing 3 and includes a protrusion, for example, a spherical rivet 8 which is received in slot 6.

The slot is oriented in a plane transverse to the shaft axis. It inhibits rotational movement of the housing 3 with encoder shaft 4. As shown, in FIG. 2, vertical movement of the axes of the shafts 2 and 4 will be permitted by sliding vertical movement of the rivet in the slot 6. Horizontal movement of the shafts 2 and 4 will cause some upward movement of the rivet in the slot and a slight rotation of the housing as it pivots about rivet 8. Any error to the tracking of the encoder introduced by this rotational movement around rivet 8 is negligible in even the highest quality printing applications.

In assembly, the first member 5 and the second member 9 are independently mounted to the frame 1 and the encoder housing, respectively. Rotation of the encoder housing 3 and second member 9 allows the rivet 8 to move across ramp 7 flexing the flexible member 5 until the rivet snaps into the slot 6.

Thus, not only does this structure provide an accuracy improvement over the prior art due to the rigid connection between the shaft 2 and rotational member 4 and a cost saving due to the elimination of the flexible coupling, it also is extremely easy to assemble.

The invention has been described in detail with particular reference to a preferred embodiment thereof, but it will be understood that variations and modifications can be effected within the spirit and scope of the invention as described hereinabove and as defined in the appended claims.

I claim:

1. In apparatus including a frame, a component shaft rotatable with respect to the frame about an axis, an encoder for monitoring the angular displacement of the shaft, the encoder having a housing and an encoder shaft rotatable with respect to the housing;

the improvement wherein:
(1) the encoder shaft is rigidly fixed to and rotatable with the component shaft, and
(2) a rotational motion preventing means is provided which prevents substantial rotational motion of the encoder housing about the axis while permitting motion of the housing with the component shaft transverse to the axis, said rotational motion preventing means including a first member having a slot which member is fixed to the frame and a second member having a protrusion slidable within said slot which second member is fixed to the encoder housing, motion of the encoder housing transverse to the axis being permitted by sliding movement of the protrusion in the slot and slight rotational movement of the housing about the protrusion.

2. The improvement according to claim 1 wherein said first member is flexible and includes a ramp which ramp is engageable by the protrusion during assembly to permit easy access of the protrusion to the slot.

* * * * *